United States Patent
Chang et al.

(10) Patent No.: US 10,978,450 B2
(45) Date of Patent: Apr. 13, 2021

(54) FINFET ISOLATION STRUCTURE AND METHOD FOR FABRICATING THE SAME

(71) Applicant: TAIWAN SEMICONDUCTOR MANUFACTURING COMPANY LIMITED, Hsin-Chu (TW)

(72) Inventors: Che-Cheng Chang, New Taipei (TW); Chih-Han Lin, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/704,619

(22) Filed: Dec. 5, 2019

(65) Prior Publication Data

US 2020/0111783 A1 Apr. 9, 2020

Related U.S. Application Data

(63) Continuation of application No. 15/414,413, filed on Jan. 24, 2017, now Pat. No. 10,504,895, which is a continuation of application No. 14/939,310, filed on Nov. 12, 2015, now Pat. No. 9,577,036.

(51) Int. Cl.
| | |
|---|---|
| *H01L 27/088* | (2006.01) |
| *H01L 29/06* | (2006.01) |
| *H01L 29/66* | (2006.01) |
| *H01L 29/78* | (2006.01) |
| *H01L 21/764* | (2006.01) |

(Continued)

(52) U.S. Cl.
CPC ...... *H01L 27/0886* (2013.01); *H01L 21/0217* (2013.01); *H01L 21/0228* (2013.01); *H01L 21/02164* (2013.01); *H01L 21/764* (2013.01); *H01L 21/823431* (2013.01); *H01L 29/0638* (2013.01); *H01L 29/0649* (2013.01); *H01L 29/0653* (2013.01); *H01L 29/66537* (2013.01); *H01L 29/66545* (2013.01); *H01L 29/7851* (2013.01); *H01L 29/66795* (2013.01)

(58) Field of Classification Search
None
See application file for complete search history.

(56) References Cited

U.S. PATENT DOCUMENTS

| | | |
|---|---|---|
| 7,208,796 B2 | 4/2007 | Chang et al. |
| 7,994,020 B2 | 8/2011 | Lin et al. |
| 8,519,481 B2 | 8/2013 | Yuan et al. |

(Continued)

FOREIGN PATENT DOCUMENTS

| | | |
|---|---|---|
| CN | 101038923 A | 9/2007 |
| CN | 101183678 A | 5/2008 |

(Continued)

*Primary Examiner* — Zandra V Smith
*Assistant Examiner* — Lawrence C Tynes, Jr.
(74) *Attorney, Agent, or Firm* — Cooper Legal Group, LLC

(57) ABSTRACT

A semiconductor device includes a semiconductor device and a semiconductor fin on the semiconductor substrate, in which the semiconductor fin has a fin isolation structure at a common boundary that is shared by the two cells. The fin isolation structure has an air gap extending from a top of the semiconductor fin to a stop layer on the semiconductor substrate. The air gap divides the semiconductor fin into two portions of the semiconductor fin. The fin isolation structure includes a dielectric cap layer capping a top of the air gap.

20 Claims, 16 Drawing Sheets

(51) Int. Cl.
*H01L 21/02* (2006.01)
*H01L 21/8234* (2006.01)

(56) References Cited

U.S. PATENT DOCUMENTS

| | | |
|---|---|---|
| 8,723,271 B2 | 5/2014 | Yuan et al. |
| 8,780,602 B2 | 7/2014 | Lue |
| 9,123,774 B2 | 9/2015 | Suk et al. |
| 9,299,835 B1 | 3/2016 | Anderson et al. |
| 9,312,274 B1* | 4/2016 | Bryant ............... H01L 21/845 |
| 9,496,363 B1 | 11/2016 | Chang et al. |
| 9,536,878 B2 | 1/2017 | Kim |
| 9,577,036 B1 | 2/2017 | Chang et al. |
| 9,917,176 B2 | 3/2018 | Chang et al. |
| 2010/0015778 A1 | 1/2010 | Lin et al. |
| 2011/0068404 A1 | 3/2011 | Sugiura et al. |
| 2011/0084340 A1 | 4/2011 | Yuan et al. |
| 2011/0092030 A1 | 4/2011 | Or-Bach et al. |
| 2011/0263094 A1 | 10/2011 | Lin et al. |
| 2012/0187418 A1 | 7/2012 | Yin et al. |
| 2013/0277757 A1 | 10/2013 | Yuan et al. |
| 2014/0001572 A1 | 1/2014 | Bohr et al. |
| 2014/0103452 A1 | 4/2014 | Chang et al. |
| 2015/0054089 A1 | 2/2015 | Hong et al. |
| 2015/0243745 A1 | 8/2015 | Kelly et al. |
| 2016/0056181 A1 | 2/2016 | Anderson et al. |
| 2016/0064406 A1 | 3/2016 | Natori et al. |
| 2016/0099342 A1* | 4/2016 | Basker ............... H01L 29/161 438/283 |
| 2016/0268500 A1 | 9/2016 | Furuhashi et al. |
| 2016/0329249 A1 | 11/2016 | Chang et al. |
| 2017/0092735 A1 | 3/2017 | Hashemi et al. |

FOREIGN PATENT DOCUMENTS

| | | |
|---|---|---|
| CN | 102044469 A | 5/2011 |
| CN | 102099902 A | 6/2011 |
| CN | 104718612 A | 6/2015 |
| TW | 201413957 A | 4/2014 |
| TW | 201427010 A | 7/2014 |
| TW | 201445710 A | 12/2014 |

\* cited by examiner

US 10,978,450 B2

FINFET ISOLATION STRUCTURE AND METHOD FOR FABRICATING THE SAME

RELATED APPLICATIONS

This application is a continuation of U.S. Non-provisional patent application Ser. No. 15/414,413, filed on Jan. 24, 2017, which is a continuation of U.S. Non-provisional patent application Ser. No. 14/939,310, filed on Nov. 12, 2015. U.S. Non-provisional patent application Ser. No. 15/414,413 and U.S. Non-provisional patent application Ser. No. 14/939,310 are herein incorporated by reference.

BACKGROUND

When a semiconductor device such as a metal-oxide-semiconductor field-effect transistor (MOSFET) is scaled down through various technology nodes, device packing density and device performance are challenged by device layout and isolation. In order to avoid leakage between neighboring devices (cells), the standard cell layout adopts dummy polycrystalline silicon (poly) segments formed on edges of a silicon oxide definition (OD) region such as an active region of a standard cell, i.e., poly-on-OD-edge (PODE).

As the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. However, conventional FinFET devices and methods of fabricating FinFET devices have not been entirely satisfactory in adopting the PODE for isolating two neighboring devices (cells).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2F' and FIG. 2G' are schematic cross-sectional views of intermediate stages showing a method for fabricating the semiconductor device viewed along line B1-B1' in FIG. 2A in accordance with certain embodiments of the present disclosure.

DETAILED DESCRIPTION

Figure 1A:
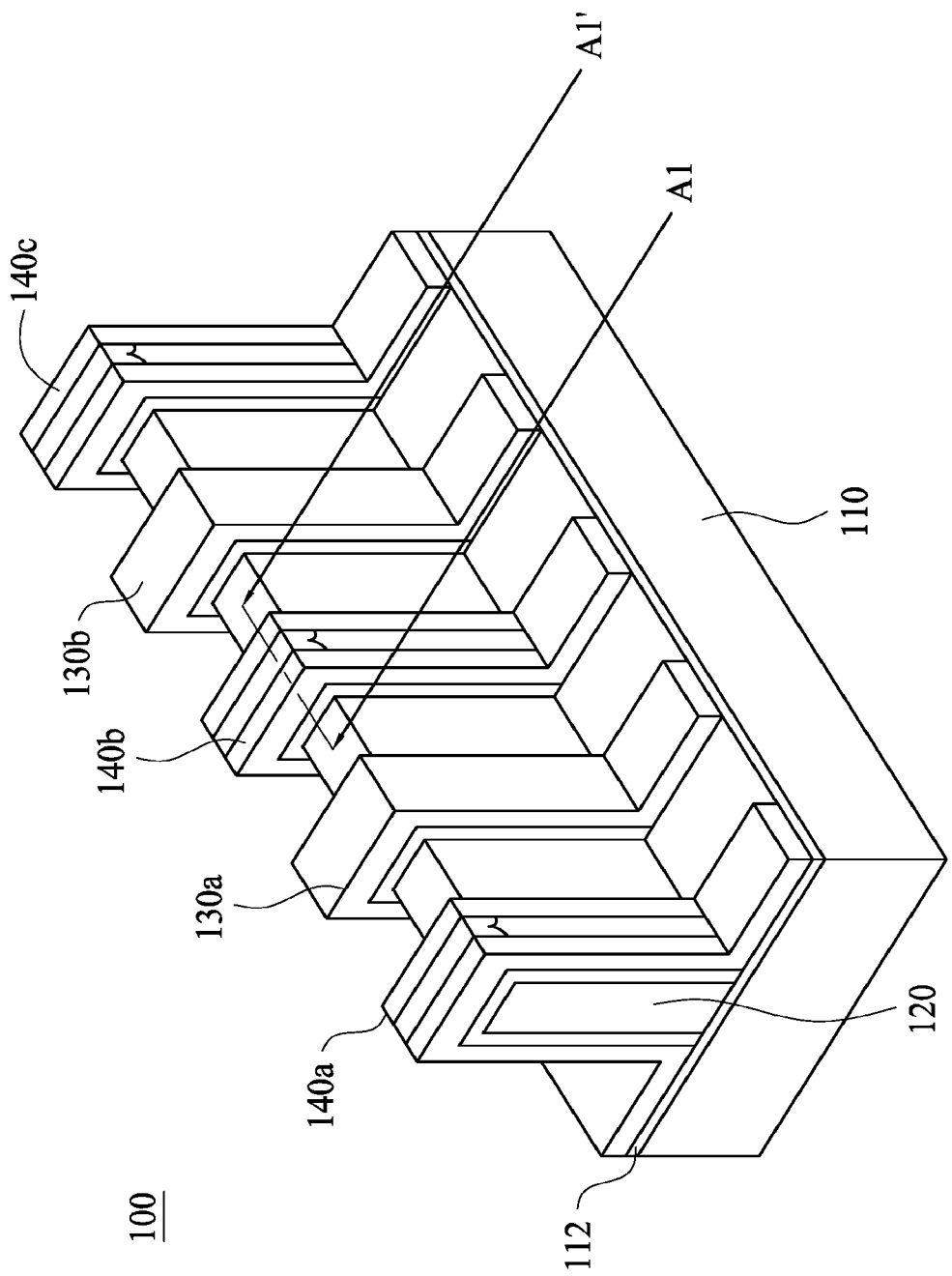
FIG. 1A is a schematic three-dimensional diagram showing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Embodiments of the present disclosure are directed to fin-like field-effect transistor (FinFET) devices between which a fin isolation structure is disposed as a PODE for preventing leakage between neighboring devices (cells). The PODE helps to achieve better device performance and better poly profile control. The fin isolation structure has an air gap in a semiconductor fin to separate two neighboring cells, and a dielectric cap layer to cap a top of the air gap for subsequent processes such as metal landing. The air gap has a very low dielectric constant, and is an excellent electrical isolator. Because the air gap is formed within the semiconductor fin, no additional area is needed to form the fin isolation structure, and thus the device size can be shrunk.

Figure 1B:
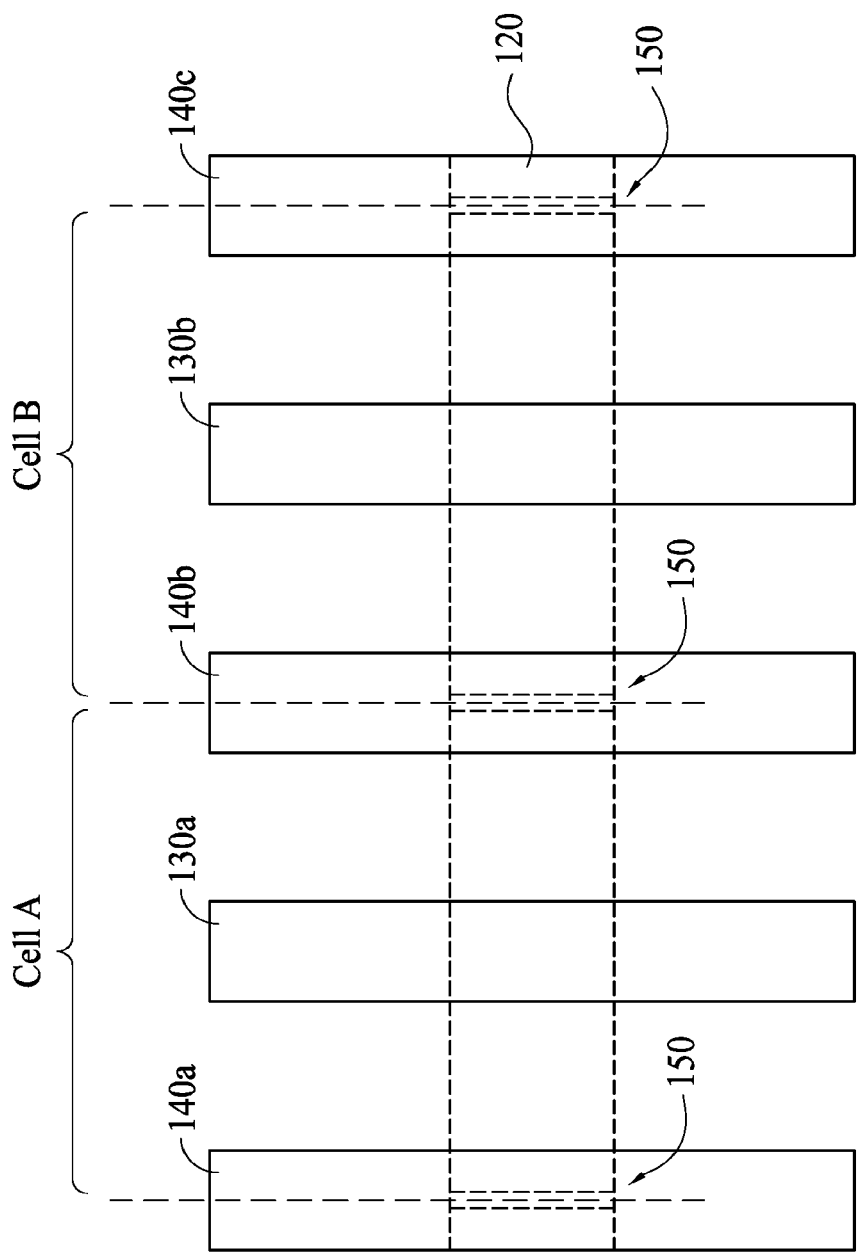
FIG. 1B is a schematic top view of the semiconductor device shown in FIG. 1A.

Referring to FIG. 1A and FIG. 1B, FIG. 1A is a schematic three-dimensional diagram of a semiconductor device 100 in accordance with some embodiments of the present disclosure, and FIG. 1B is a schematic top view of the semiconductor device 100 shown in FIG. 1A. The semiconductor device 100 includes a semiconductor substrate 110, a stop layer 112 on the semiconductor substrate 110, a semiconductor fin 120 on the stop layer 112, gate structures 130a and 130b crossing over the semiconductor fin 120, and dummy gate structures 140a, 140b and 140c crossing over the semiconductor fin 120. The semiconductor substrate 110 is defined as any construction including semiconductor materials, including, but is not limited to, bulk silicon, a semiconductor wafer, or a silicon germanium substrate. Other semiconductor materials including group III, group IV, and group V elements may also be used. The stop layer 112 includes, but is not limited to, $SiGeO_x$, SiGe, $SiO_x$, SiP or $SiPO_x$, where x is greater than 0. The stop layer 112 has a thickness in a range from about 1 nm to about 50 nm. The semiconductor fin 120 protrudes from the semiconductor substrate 110. For forming the semiconductor fin 120, a semiconductor layer may be formed on the semiconductor substrate 110 and is etched until the stop layer 112 is exposed. Because the etching stops at the top of the stop layer 112, a height of the semiconductor fin 120 is approximately equal to a thickness of the semiconductor layer, such that the thickness of the semiconductor layer can be well controlled. Consequently, the height of the semiconductor fin 120, and thus the channel width of the FinFET (semiconductor device 100) can be well controlled in view of the requirements of circuit design, thereby obtaining good device performance.

The gate structures 130a and 130b may be referred herein as functional or operational gate structures. As shown in FIG. 1B, a cell A and a cell B abutting the cell A are disposed on the semiconductor fin 120. The dummy gate structures 140a and 140b are used to cover and protect the ends of the semiconductor fin 120 of the cell A during processing, and the dummy gate structures 140b and 140c are used to cover and protect the ends of the semiconductor fin 120 of the cell B during processing, thereby providing additional reliability during processing. That is, the dummy gate structures 140a, 140b and 140c are not electrically connected as gates for FinFET devices, and have no function in the circuit. Each of the dummy gate structures 140a, 140b and 140c has a fin isolation structure 150. The cell A is electrically isolated from the cell B by the fin isolation structure 150 of the dummy gate structures 140b which acts as a PODE for preventing leakage between the cell A and the cell B. In some embodiments, another cell may be connected to the cell A through the dummy gate structure 140a, and another cell may be connected to the cell B through the dummy gate structure 140c.

It is noted that embodiments of the present disclosure are also applicable to only the cell A or the cell B, i.e. to a semiconductor fin with only the cell A or the cell B, in which two opposite ends of the semiconductor fin have the fin isolation structures respectively.

Figure 1C:
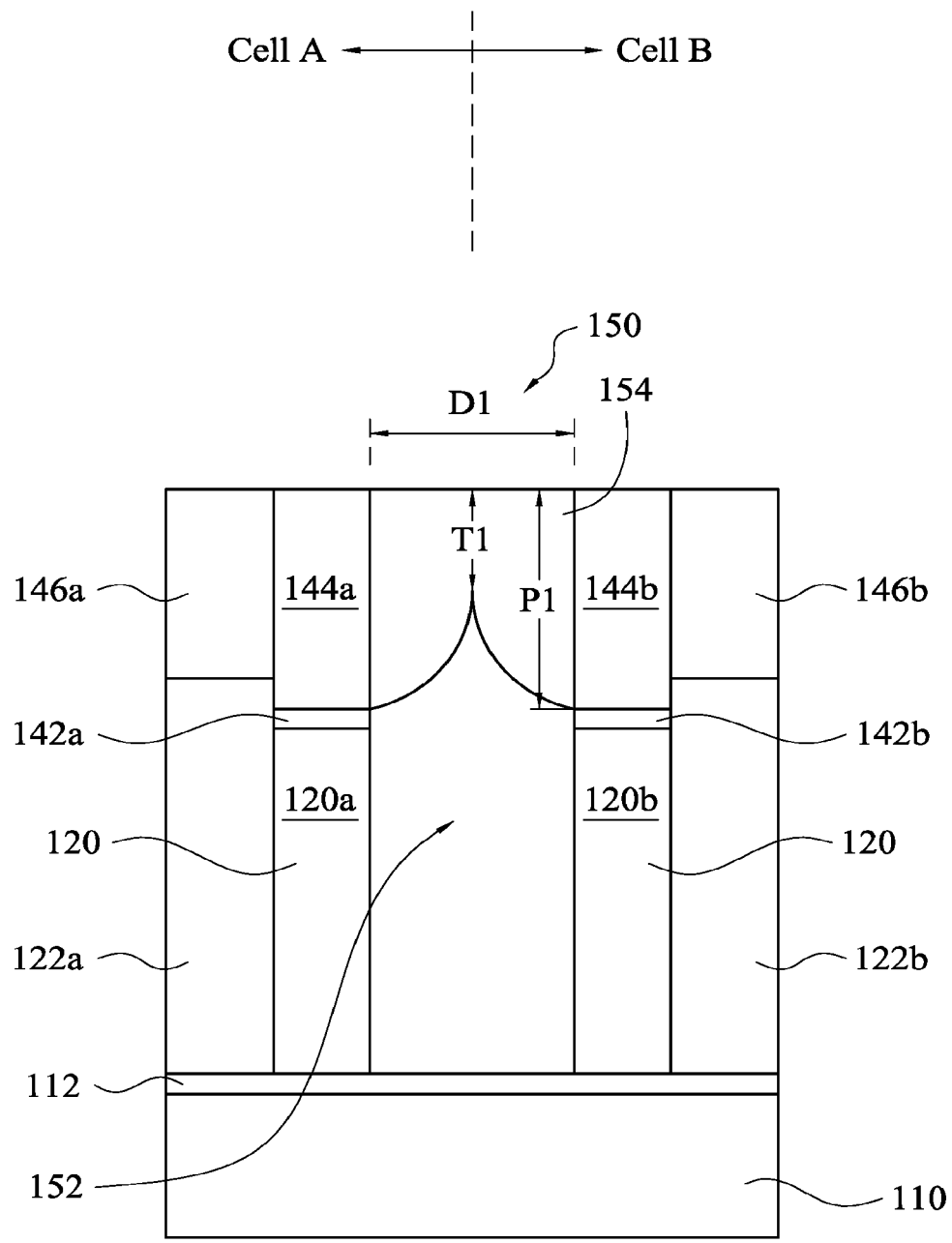
FIG. 1C to FIG. 1F are schematic cross-sectional views showing various types of fin isolation structure for the semiconductor device viewed along line A1-A1' in FIG. 1A.

Because the dummy gate structures 140a, 140b and 140c have the same structure, the dummy gate structure 140b is used herein as an example for explaining the details of the fin isolation structure 150. As shown in FIG. 1B, the semiconductor fin 120 at the dummy gate structure 140b has the fin isolation structure 150 at a common boundary that is shared by the two cells A and B. Referring to FIG. 1C, FIG. 1C is a schematic cross-sectional view showing a type of the fin isolation structure 150 for the semiconductor device 100 viewed along line A1-A1' in FIG. 1A. As shown in FIG. 1C, the fin isolation structure 150 has an air gap 152 dividing the semiconductor fin 120 into two portions 120a and 120b of the semiconductor fin 120. The air gap 152 extends to the stop layer 112 from tops of two portions 120a and 120b of the semiconductor fin 120. The air gap 152 has a very low dielectric constant and is an excellent electrical isolator, such that leakage between the cell A and the cell B can be avoided with a small width of the air gap 152. In some embodiments, the two portions 120a and 120b of the semiconductor fin 120 are spaced at a distance D1 (the width of the air gap 152) in a range from about 5 nm to about 50 nm, and the claimed scope of the present disclosure is not limited in this respect. Because the air gap 152 is formed within the semiconductor fin 120, no additional area is needed to form the fin isolation structure 150, and thus the device size can be shrunk.

The fin isolation structure 150 includes a dummy gate dielectric 142a on the portion 120a, a dummy gate dielectric 142b on the portion 120b, a dummy gate spacer 144a on the dummy gate dielectric 142a, a dummy gate spacer 144b on the dummy gate dielectric 142b, and a dielectric cap layer 154 sandwiched between the dummy gate spacer 144a and the dummy gate spacer 144b. The dielectric cap layer 154 can be used as a support for subsequent processes such as metal landing. Only a relatively small thickness T1 of the dielectric cap layer 154 is needed as long the dielectric cap layer 154 is strong enough to support the elements to be implemented in the subsequent processes. Thus, the dielectric constant of the area between the two portions 120a and 120b of the semiconductor fin 120 can be kept as small as possible, because the air gap 152 occupies a large part of the area between the two portions 120a and 120b. In some embodiments, the dielectric cap layer 154 has the thickness T1 extending from top surfaces of the dummy gate spacer 144a and 144b towards the semiconductor substrate 110, in which the thickness T1 is smaller than a height P1 of each of the dummy gate spacers 144a and 144b. The dielectric cap layer 154 may include silicon nitride (SiN), oxynitride, silicon carbon (SiC), silicon oxynitride (SiON), oxide, and the like. In addition, the top surface of the dielectric cap layer 154 may be flat and coplanar with the top surfaces of the dummy gate spacers 144a and 144b, thereby facilitating the subsequent processes.

In some embodiments, each of the dummy gate spacers 144a and 144b includes a dielectric material, such as silicon nitride, silicon carbide, silicon oxynitride, other suitable materials, and/or combinations, but embodiments of the present disclosure are not limited thereto. In some embodiments, each of the dummy gate dielectrics 142a and 142b may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate dielectric 142 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The semiconductor device 100 may further include epitaxial layers 122a and 122b on the semiconductor substrate 110. The epitaxial layers 122a is located at one side of the two portions 120a and 120b of the semiconductor fin 120, and is a source/drain portion of the cell A. The epitaxial layer 122b is located at the other side of the two portions 120a and 120b of the semiconductor fin 120, and is a source/drain portion of the cell B. The epitaxial layers 122a and 122b may be doped by performing an implanting process to implant appropriate dopants to complement the dopants in the semiconductor fin 120. In some embodiments, the epitaxial layers 122a and 122b may be formed by forming recesses (not shown) in the semiconductor fin 120 and epitaxially growing material in the recesses. The epitaxial layers 122a and 122b may be doped either through an implantation method as discussed above, or else by in-situ doping as the material is grown. The semiconductor device 100 may further include dielectric layers 146a and 146b respectively on the epitaxial layers 122a and 122b, in which the dielectric layers 146a and 146b sandwich the dummy gate spacers 144a and 144b and the dielectric cap layer 154. The dielectric layers 146a and 146b may include silicon nitride (SiN), silicon carbon (SiC), silicon oxynitride (SiON), oxide, and the like.

Figure 1D:
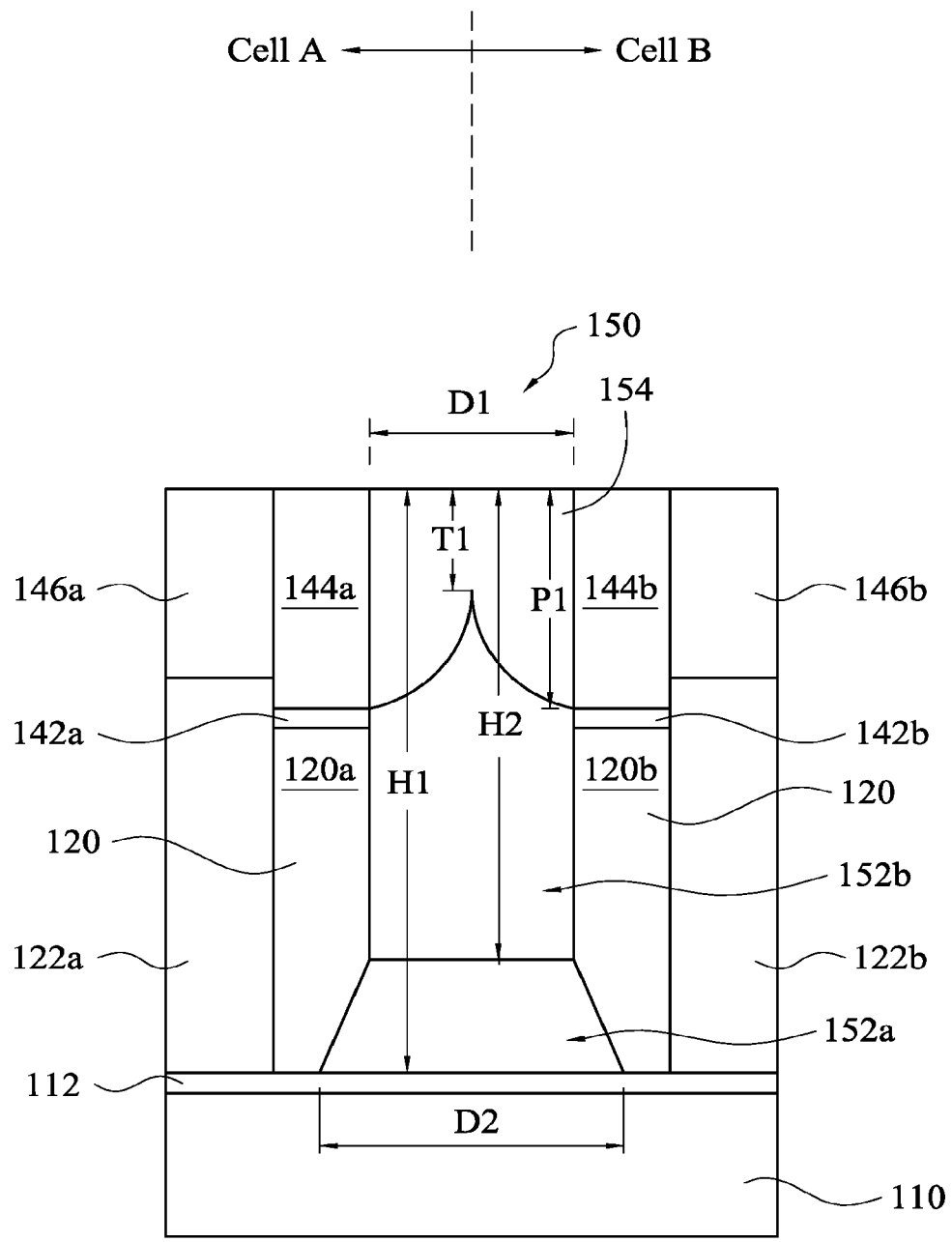

Embodiments of the present disclosure further provide several types of fin isolation structure 150 hereinafter. Referring to FIG. 1D, FIG. 1D is a schematic cross-sectional view showing another type of fin isolation structure 150 for the semiconductor device 100 viewed along line A1-A1' in FIG. 1A. As shown in FIG. 1D, the fin isolation structure 150 has a first air gap 152a on the stop layer 112, and a second air gap 152b above the first air gap 152a. The first air gap 152a has a trapezoidal cross-section, and the second air gap 152b has a rectangular cross-section, i.e. a width D2 of a bottom of the first air gap 152a is greater than a width D1 of a bottom of the second air gap 152b. The ratio of the height H2 of the second air gap 152b and the dielectric cap layer 154 to the total height H1 of the first air gap 152a, the second air gap 152b and the dielectric cap layer 154 is in a range from about 0.05 to about 1. The first air gap 152a and the second air gap 152b divide the semiconductor fin 120 into two portions 120a and 120b of the semiconductor fin 120. The first air gap 152a, the second air gap 152b and the dielectric cap layer 154 have low dielectric constants and are excellent electrical isolators, such that leakage between the cell A and the cell B can be avoided with small widths of the first air gap 152a, the second air gap 152b and the dielectric cap layer 154. In some embodiments, the two portions 120a and 120b of the semiconductor fin 120 are spaced at a distance D1 (the width of the dielectric cap layer 154) in a range from about 5 nm to about 50 nm, and the claimed scope of the present disclosure is not limited in this respect. Because the first air gap 152a, the second air gap 152b and the dielectric cap layer 154 are formed within the semiconductor fin 120, no additional area is needed to form the fin isolation structure 150, and thus the device size can be shrunk.

Figure 1E:
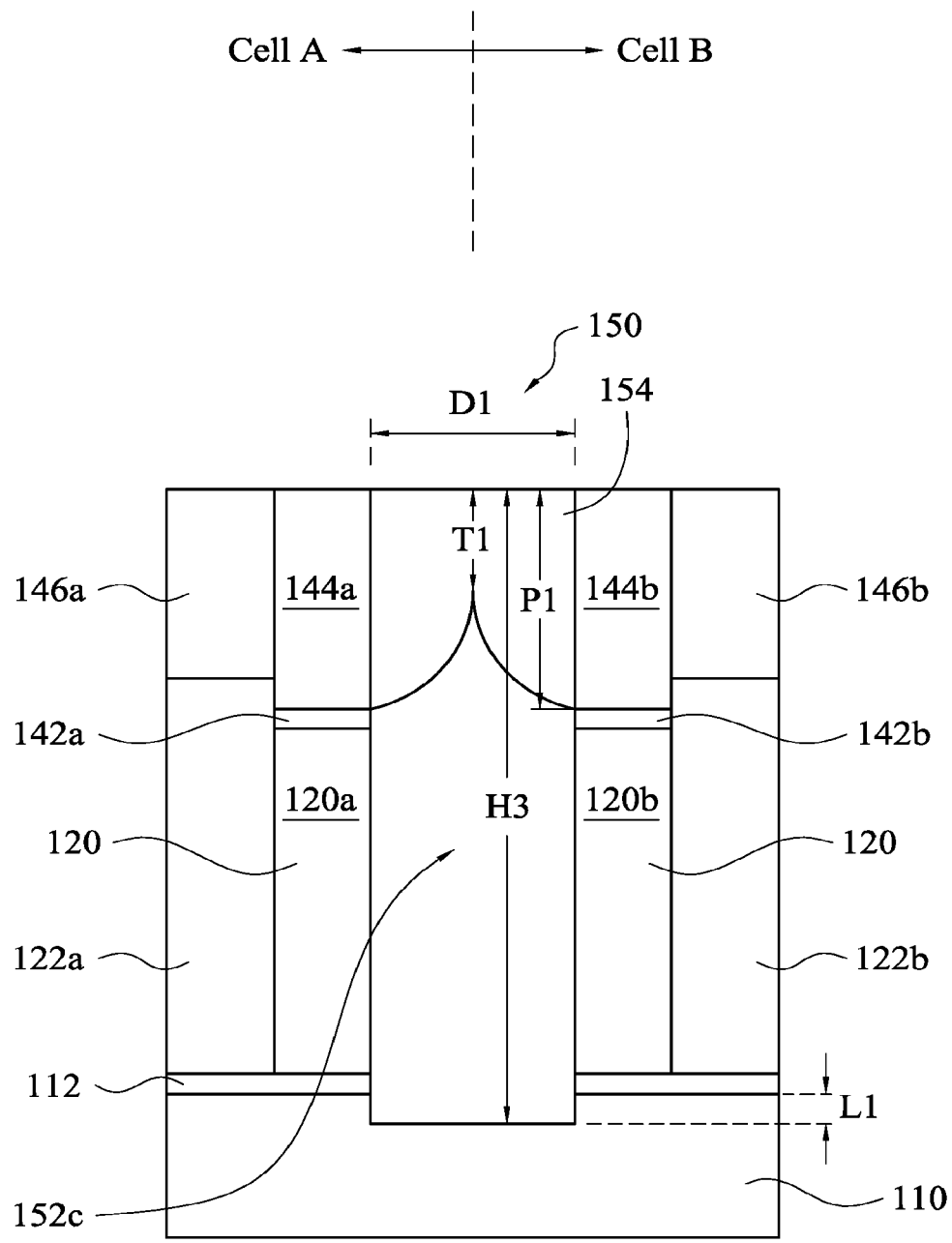

Referring to FIG. 1E, FIG. 1E is a schematic cross-sectional view showing another type of fin isolation structure 150 for the semiconductor device 100 viewed along line A1-A1' in FIG. 1A. As shown in FIG. 1E, the fin isolation structure 150 has an air gap 152c extending into a portion of the semiconductor substrate 110 through the stop layer 112 for a depth L1. The ratio of the depth L1 to the height H3 of the air gap 152c and the dielectric cap layer 154 is in a range from about 0.05 to about 1. The air gap 152c divides the semiconductor fin 120 into two portions 120a and 120b of the semiconductor fin 120. The air gap 152c and the dielectric cap layer 154 have low dielectric constants and are excellent electrical isolators, such that leakage between the cell A and the cell B can be avoided with small widths of the air gap 152c and the dielectric cap layer 154. In some embodiments, the two portions 120a and 120b of the semiconductor fin 120 are spaced at a distance D1 (the width of the dielectric cap layer 154) in a range from about 5 nm to about 50 nm, and the claimed scope of the present disclosure is not limited in this respect. Because the air gap 152c and the dielectric cap layer 154 are formed within the semiconductor fin 120, no additional area is needed to form the fin isolation structure 150, and thus the device size can be shrunk.

Figure 1F:
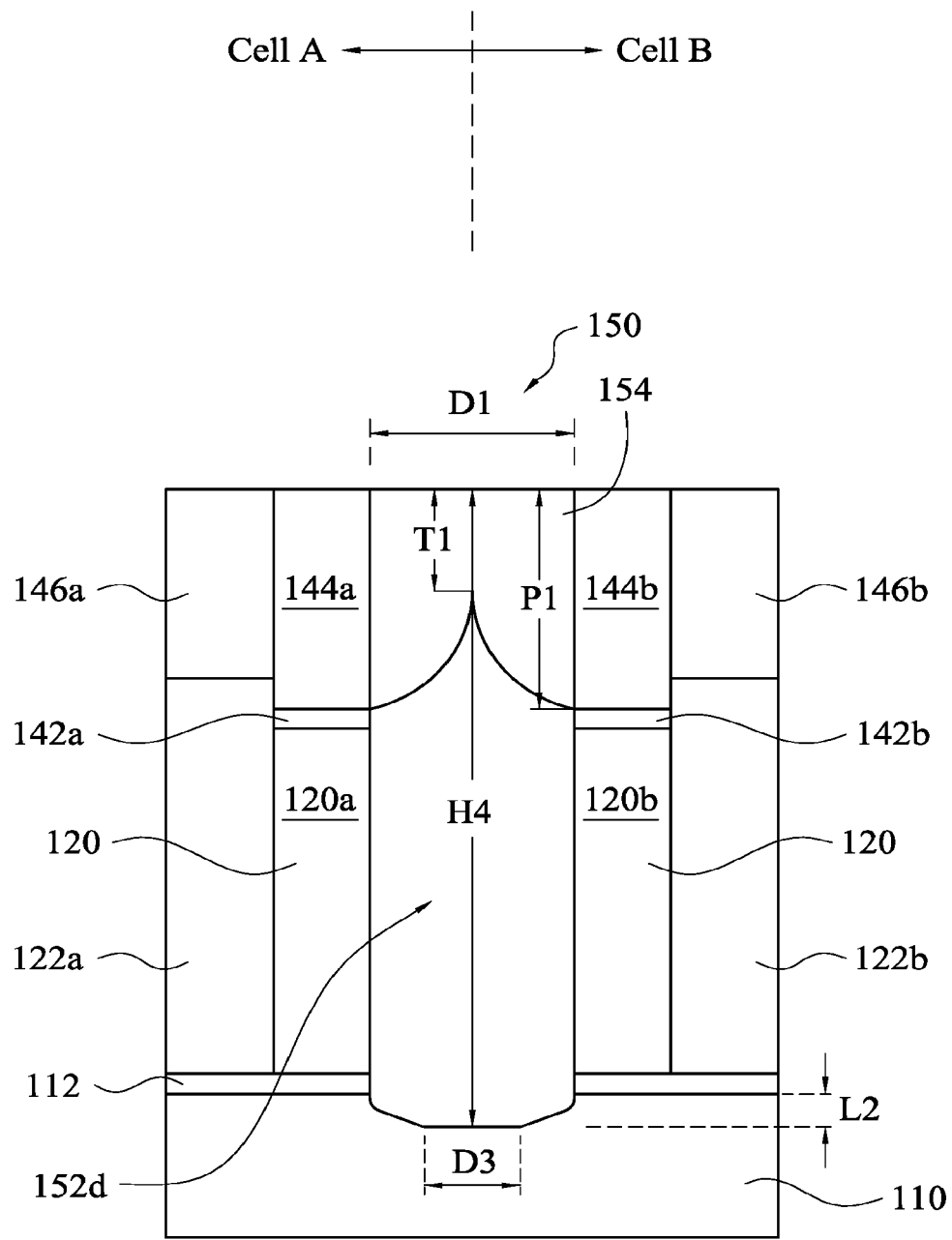

Referring to FIG. 1F, FIG. 1F is a schematic cross-sectional view showing another type of fin isolation structure 150 for the semiconductor device 100 viewed along line A1-A1' in FIG. 1A. As shown in FIG. 1F, the fin isolation structure 150 has an air gap 152d extending into a portion of the semiconductor substrate 110 through the stop layer 112 for a depth L2. The air gap 152d has a flat bottom enclosed by an arc surface, in which a width D3 of the flat bottom of the air gap 152d is smaller than a width D1 of the dielectric cap layer 154. The ratio of the depth L2 to the height H4 of the air gap 152d and the dielectric cap layer 154 is in a range from about 0.01 to about 1. The air gap 152d divides the semiconductor fin 120 into two portions 120a and 120b of the semiconductor fin 120. The air gap 152d and the dielectric cap layer 154 have low dielectric constants and are excellent electrical isolators, such that leakage between the cell A and the cell B can be avoided with small widths of the air gap 152d and the dielectric cap layer 154. In some embodiments, the two portions 120a and 120b of the semiconductor fin 120 are spaced at a distance D1 (the width of the dielectric cap layer 154) in a range from about 5 nm to about 50 nm, and the claimed scope of the present disclosure is not limited in this respect. Because the air gap 152d and the dielectric cap layer 154 are formed within the semiconductor fin 120, no additional area is needed to form the fin isolation structure 150, and thus the device size can be shrunk.

Figure 2A:
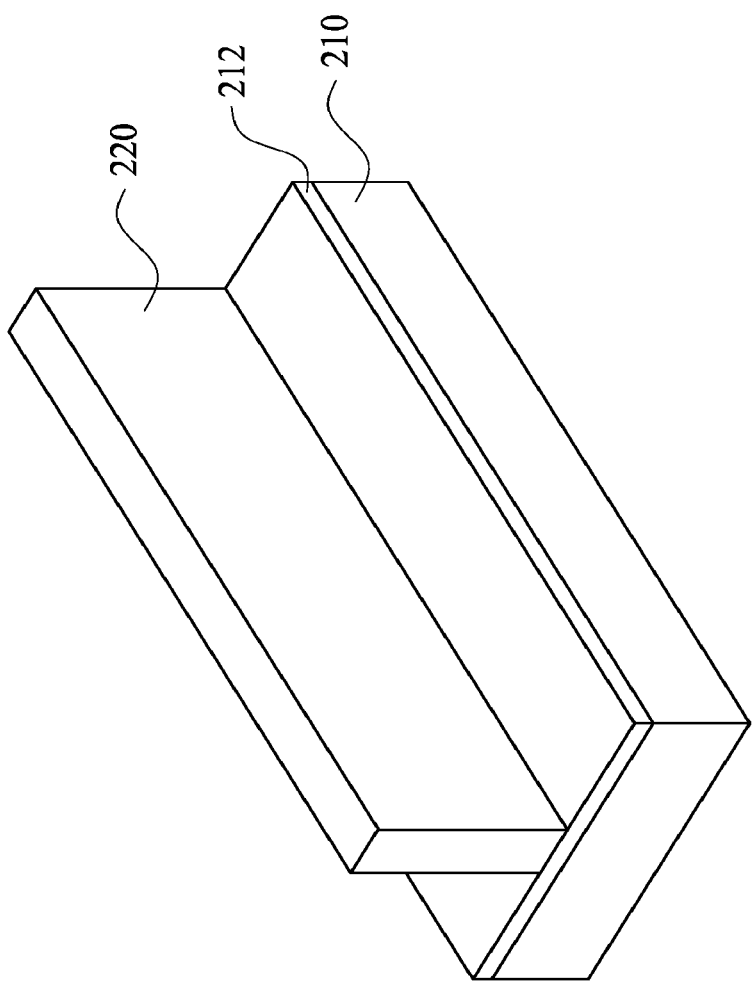
FIG. 2A and FIG. 2B are schematic three-dimensional diagrams of intermediate stages showing a method for fabricating a semiconductor device in accordance with some embodiments of the present disclosure.

Referring to FIG. 2A to FIG. 2G, FIG. 2A and FIG. 2B are schematic three-dimensional diagrams of intermediate stages showing a method for fabricating a semiconductor device 200 in accordance with some embodiments of the present disclosure, and FIG. 2C to FIG. 2G are schematic cross-sectional views of intermediate stages showing a method for fabricating the semiconductor device 200 viewed along line B1-B1' in FIG. 2A in accordance with some embodiments of the present disclosure.

As shown in FIG. 2A, a semiconductor substrate 210 is provided, and a stop layer 212 is formed on the semiconductor substrate 210 by, for example, implantation or atomic layer deposition (ALD). Then, a Si layer (not shown) is epitaxially grown on the stop layer 212, and is patterned and etched using a photolithography technique to form a semiconductor fin 220. The semiconductor substrate 210 is defined as any construction including semiconductor materials, including, but is not limited to, bulk silicon, a semiconductor wafer, or a silicon germanium substrate. Other semiconductor materials including group III, group IV, and group V elements may also be used. The stop layer 212 is formed from, but is not limited to, $SiGeO_x$, SiGe, $SiO_x$, SiP or $SiPO_x$, where x is greater than 0. The stop layer 212 has a thickness in a range from about 1 nm to about 50 nm. In some embodiments, a layer of photoresist material (not shown) is deposited over the Si layer, and is irradiated (exposed) in accordance with a desired pattern and developed to remove a portion of the photoresist material. The remaining photoresist material protects the underlying material from subsequent processing operation, such as etching. It should be noted that other masks, such as an oxide or silicon nitride mask, may also be used in the etching process. A mask may be used to control the shape of the semiconductor fin 220 during the epitaxial growth process.

Figure 2B:
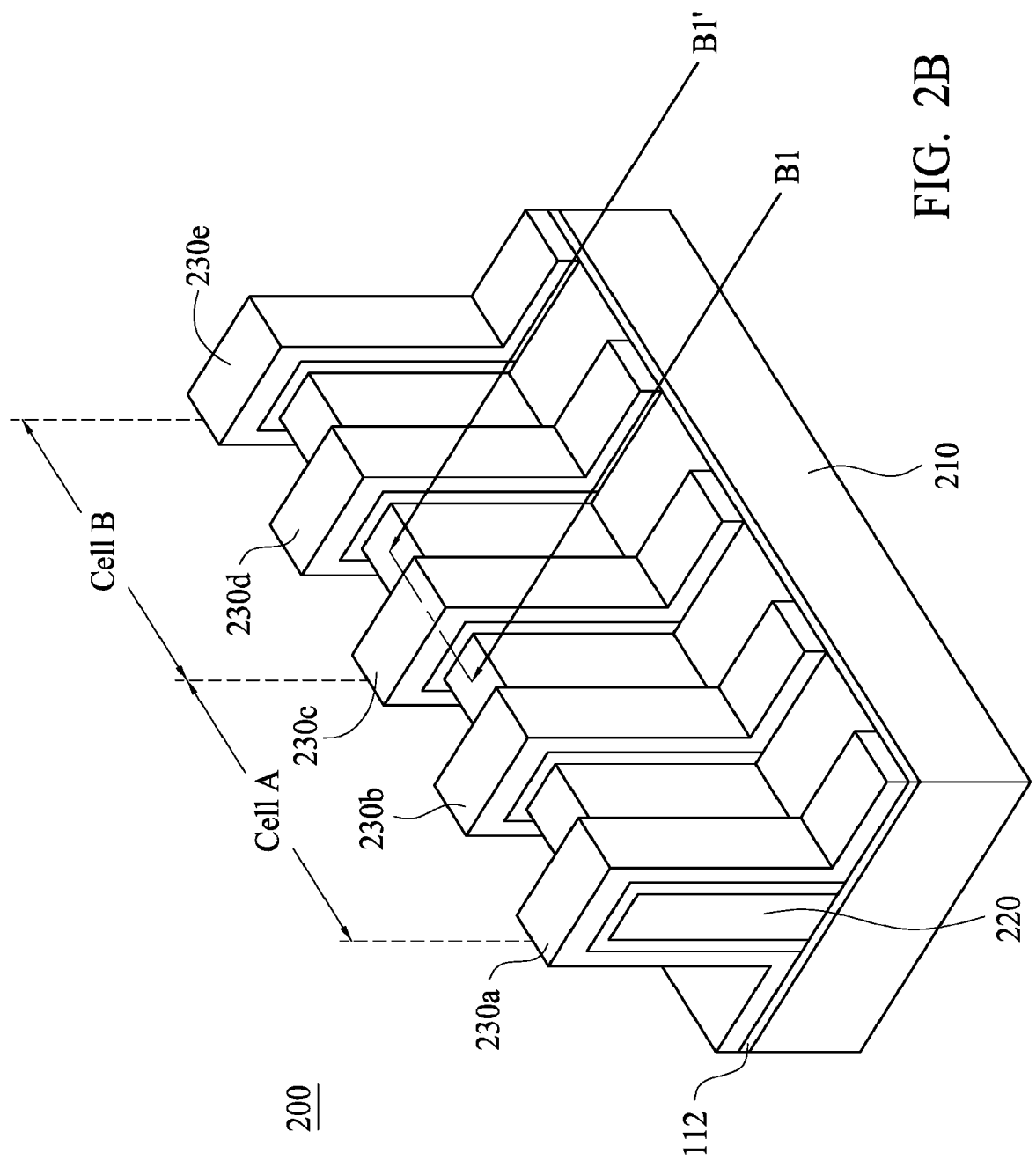

As shown in FIG. 2B, gate structures 230a, 230b, 230c, 230d and 230e are formed to cross over the semiconductor fin 220, in which the gate structures 230b and 230d are functional or operational gate structures, and the gate structures 230a, 230c and 230e will be processed later to become dummy gate structures. A cell A and a cell B abutting the cell A are defined on the semiconductor fin 220. The dummy gate structures (gate structures 230a and 230c) are used to cover and protect the ends of the semiconductor fin 220 of the cell A during processing, and the dummy gate structures (gate structures 230c and 230e) are used to cover and protect the ends of the semiconductor fin 220 of the cell B during processing, thereby providing additional reliability during processing. That is, the (dummy) gate structures 230a, 230c and 230e will be processed later to have no function in the circuit. At this time, the gate structures 230a, 230b, 230c, 230d and 230e have the same structures, and thus the gate structure 230c is used herein as an example for explaining the details thereof.

Figure 2C:
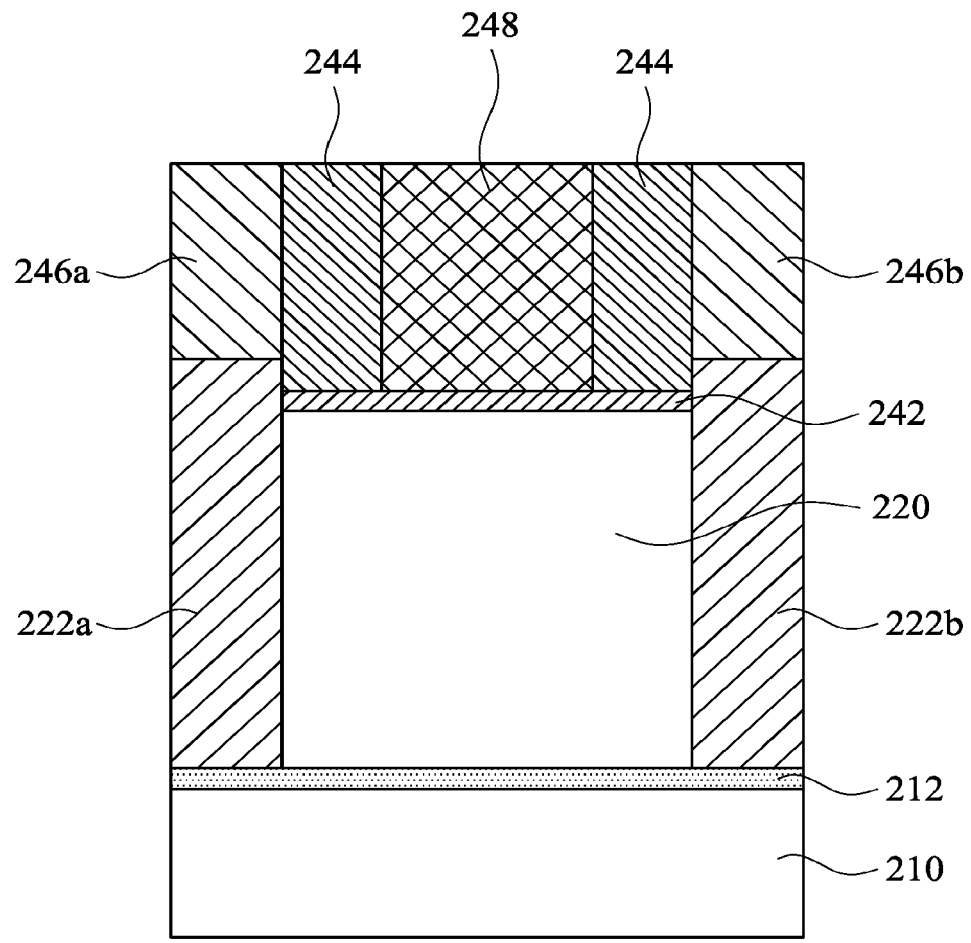
FIG. 2C to FIG. 2G are schematic cross-sectional views of intermediate stages showing a method for fabricating the semiconductor device viewed along line B1-B1' in FIG. 2A in accordance with some embodiments of the present disclosure.

As shown in FIG. 2C, a gate dielectric 242 is formed on the semiconductor fin 220. The gate dielectric 242, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate dielectric 242 may have a multilayer structure such as one layer of silicon oxide (e.g., interfacial layer) and another layer of high-k material. The gate dielectric 242 may be formed using chemical vapor deposition (CVD), physical vapor deposition (PVD), atomic layer deposition (ALD), thermal oxide, ozone oxidation, other suitable processes, or combinations thereof.

As shown in FIG. 2C, a gate conductor 248 and a gate spacer 244 are formed on the gate dielectric 242, in which the gate spacer 244 peripherally enclosing the gate conductor 248. The gate conductor 248 may be formed from a conductive material and may be selected from a group consisting of polycrystalline-silicon (poly-Si), poly-crystalline silicon-germanium (poly-SiGe), metallic nitrides, metallic silicides, metallic oxides, metals, their combinations, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. The gate conductor 248 may be deposited by chemical vapor deposition (CVD), sputter deposition, or other techniques known and used in the art for depositing conductive materials.

As shown in FIG. 2C, epitaxial layers 222a and 222b are formed on the stop layer 212. The epitaxial layers 222a is formed at one side of the semiconductor fin 220, and is a source/drain portion of the cell A. The epitaxial layer 222b is formed at the other side of the semiconductor fin 220, and is a source/drain portion of anther cell abutting the cell B. The epitaxial layers 222a and 222b may be doped by performing an implanting process to implant appropriate dopants to complement the dopants in the semiconductor fin 220. In some embodiments, the epitaxial layers 222a and 222b may be formed by forming recesses (not shown) in the semiconductor fin 120 and epitaxially growing material in the recesses. The epitaxial layers 222a and 222b may be doped either through an implantation method as discussed above, or else by in-situ doping as the material is grown. Dielectric layers 246a and 246b may be formed respectively on the epitaxial layers 222a and 222b, in which the dielectric layers 246a and 246b sandwich the gate spacer 244. The dielectric layers 246a and 246b may include silicon nitride (SiN), oxynitride, silicion carbon (SiC), silicon oxynitride (SiON), oxide, and the like and may be formed by methods utilized to form such a layer, such as chemical vapor deposition (CVD), plasma enhanced CVD, sputter, and other methods known in the art.

Then, while the gate structures 230b and 230d are used as functional or operational gate structures for the cell A and the cell B, the gate structures 230a, 230c and 230e are further processed in the subsequent operations to become dummy gate structures each of which has a fin isolation structure for isolating the cell A and the cell B.

Figure 2D:
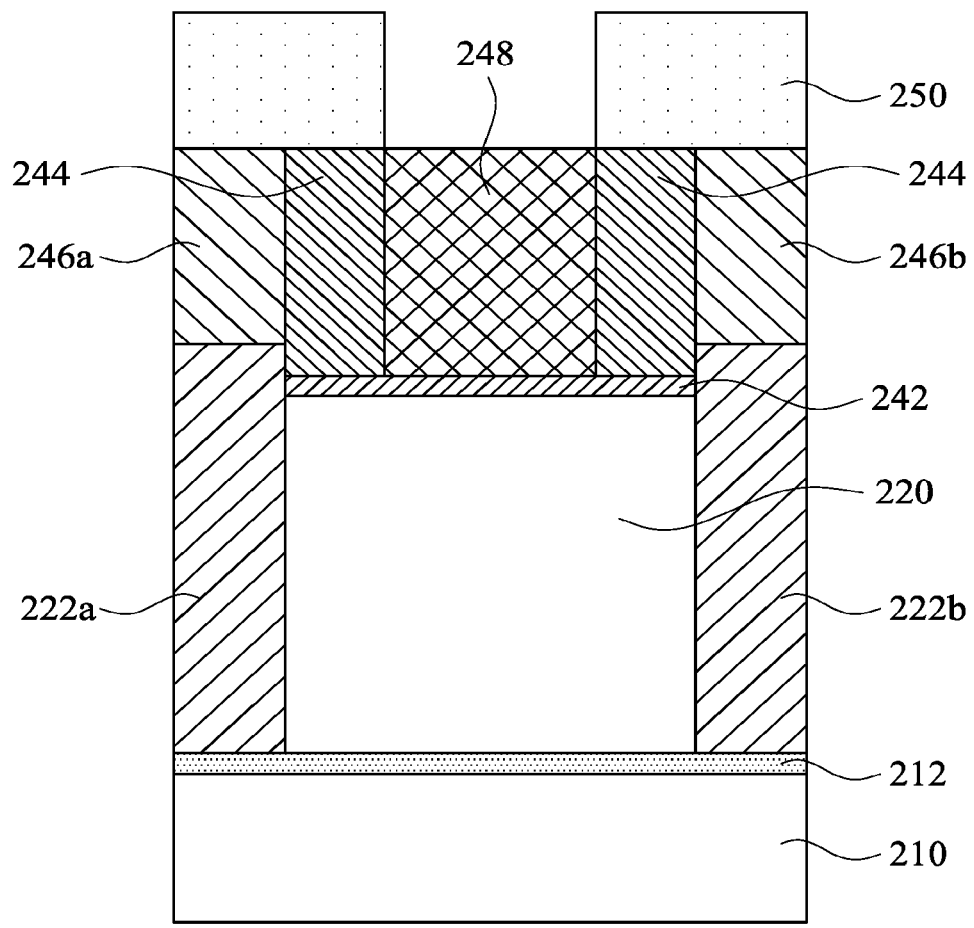
Figure 2E:
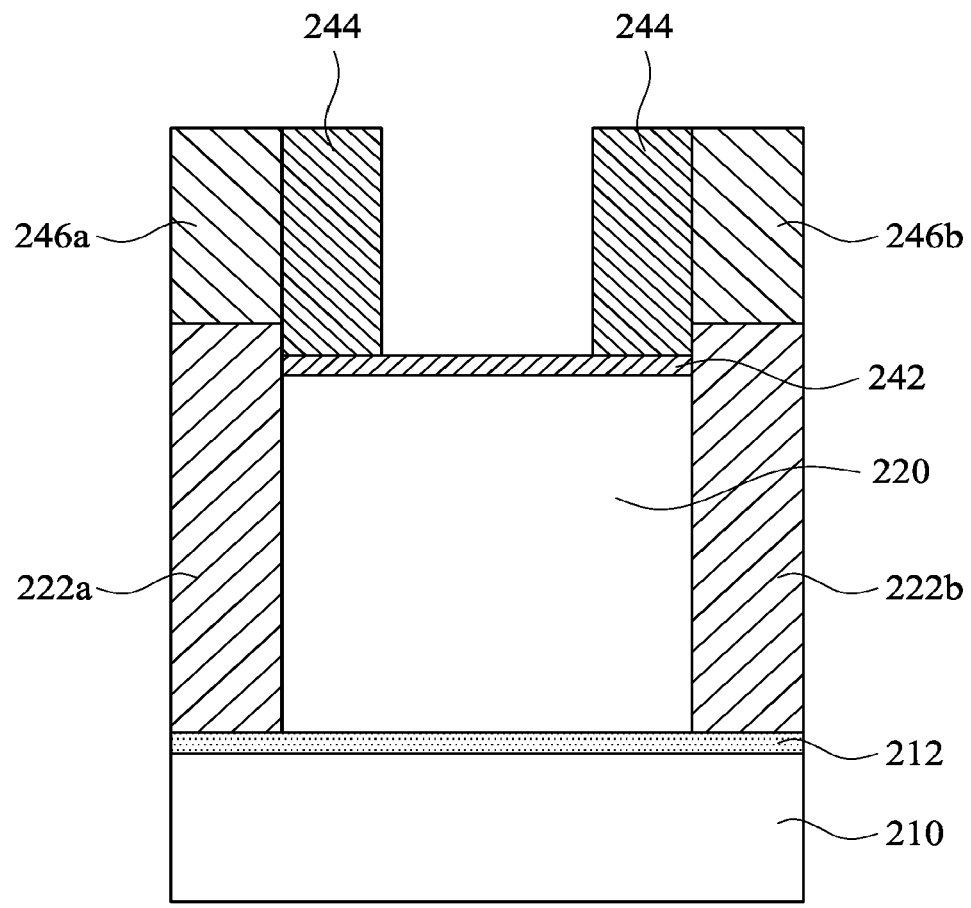

As shown in FIG. 2D, a photoresist 250 is formed and patterned over the gate conductor 248, the gate spacer 244 and the dielectric layers 246a and 246b. In some embodiments, the photoresist 250 is formed by depositing, exposing, and developing a layer of photoresist material. The photoresist 250 is patterned to expose the gate conductor 248. The gate conductor 248 may be removed by suitable wet or dry etching processes. For example, an etching solution such as, for example, $NH_4OH$, dilute-HF, and/or other suitable etchant may be used. Then, the photoresist 250 is removed to obtain a structure as shown in FIG. 2E.

Figure 2F:
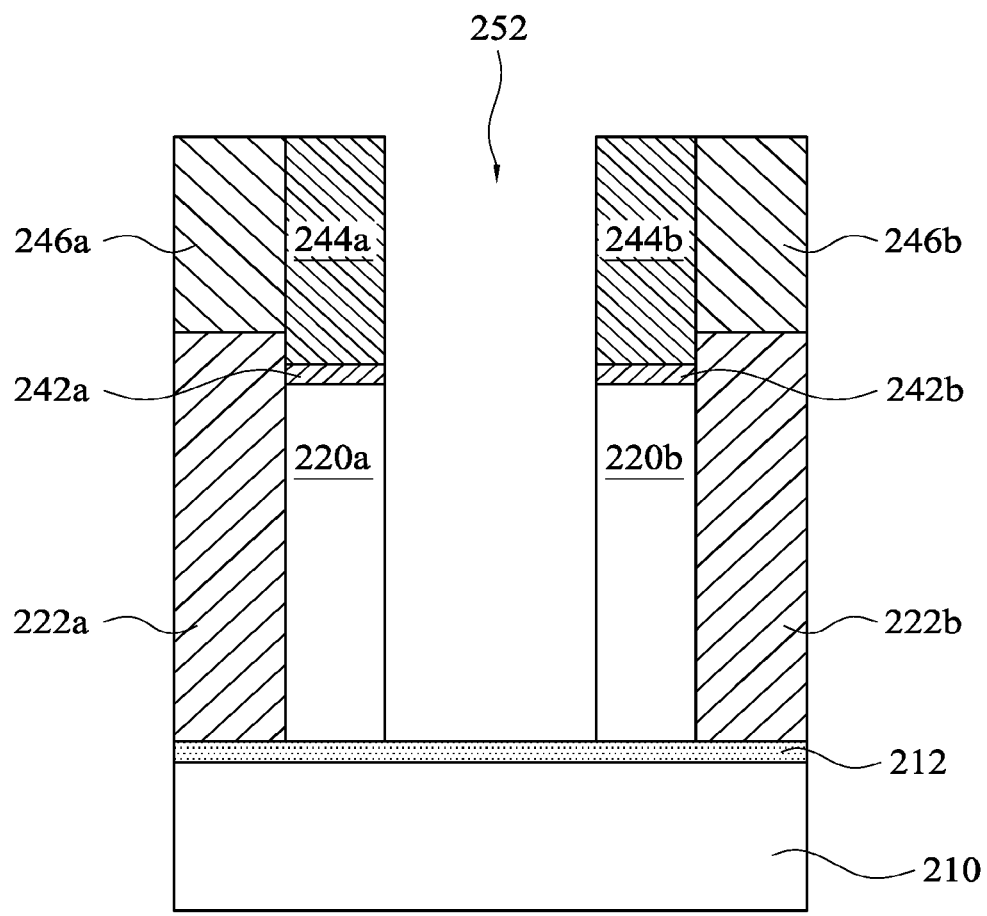
Figure 2F:
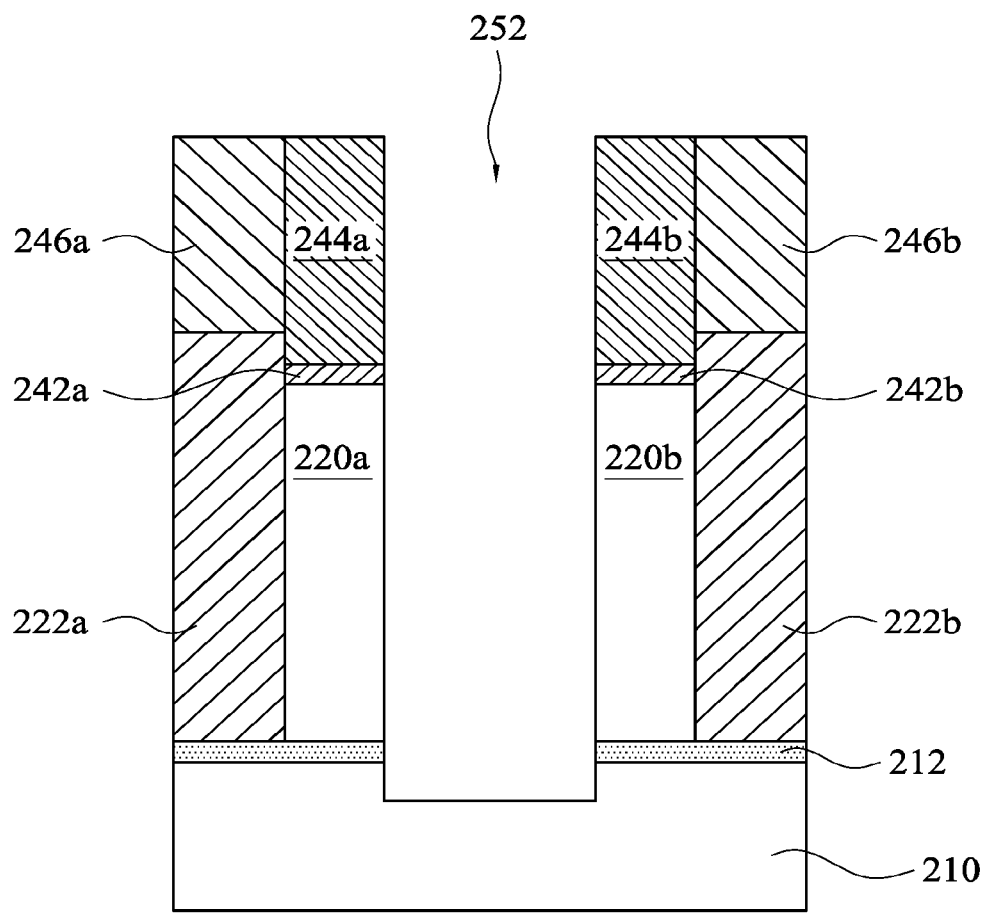
Figure 2G:
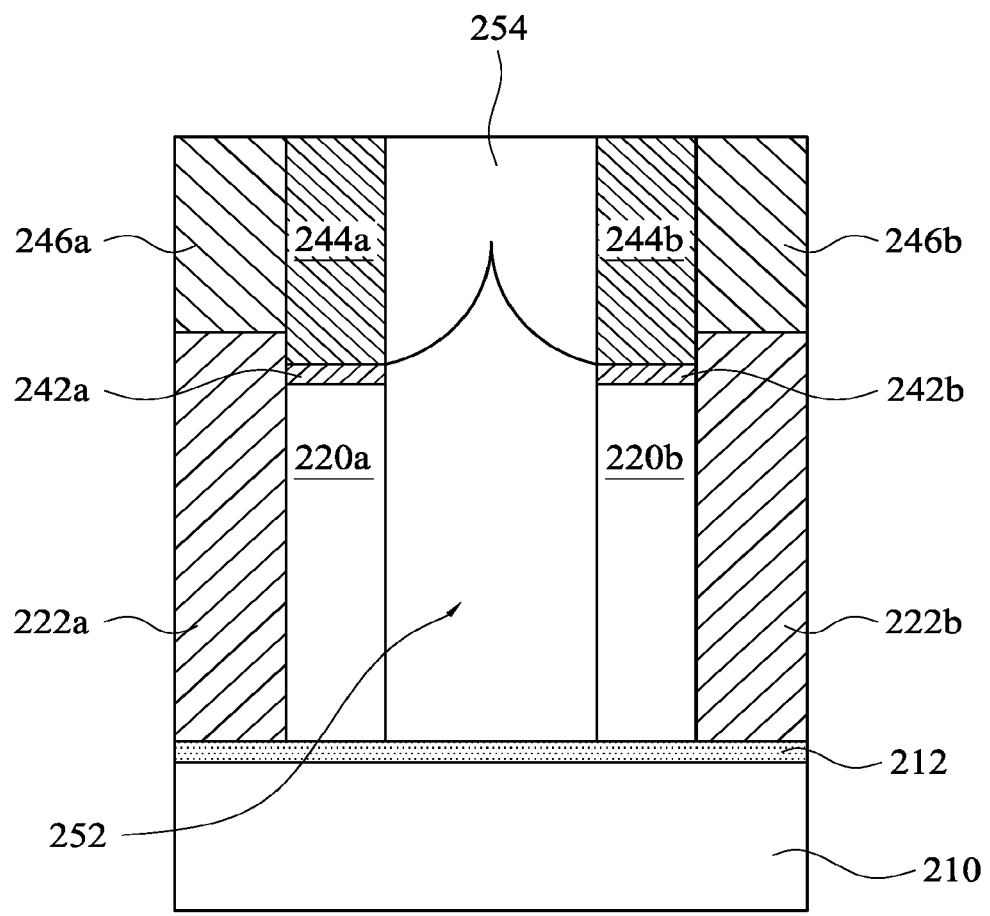
Figure 2G:
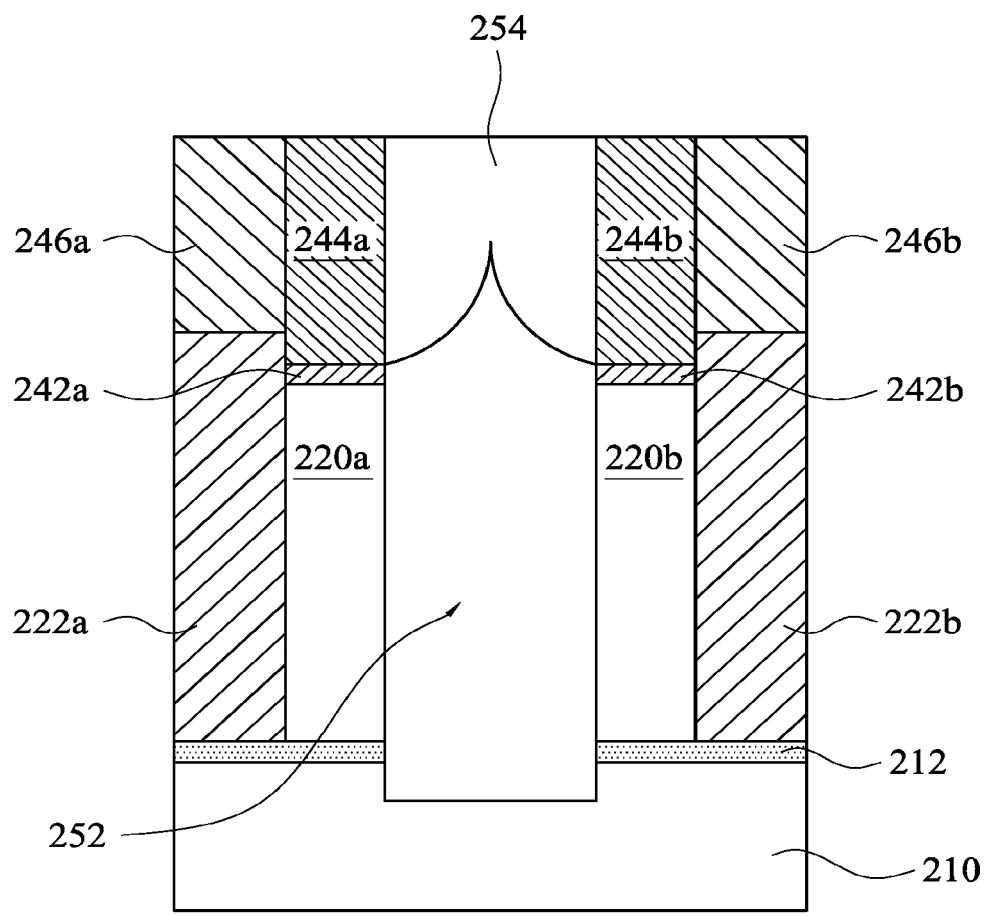
Figure 3:
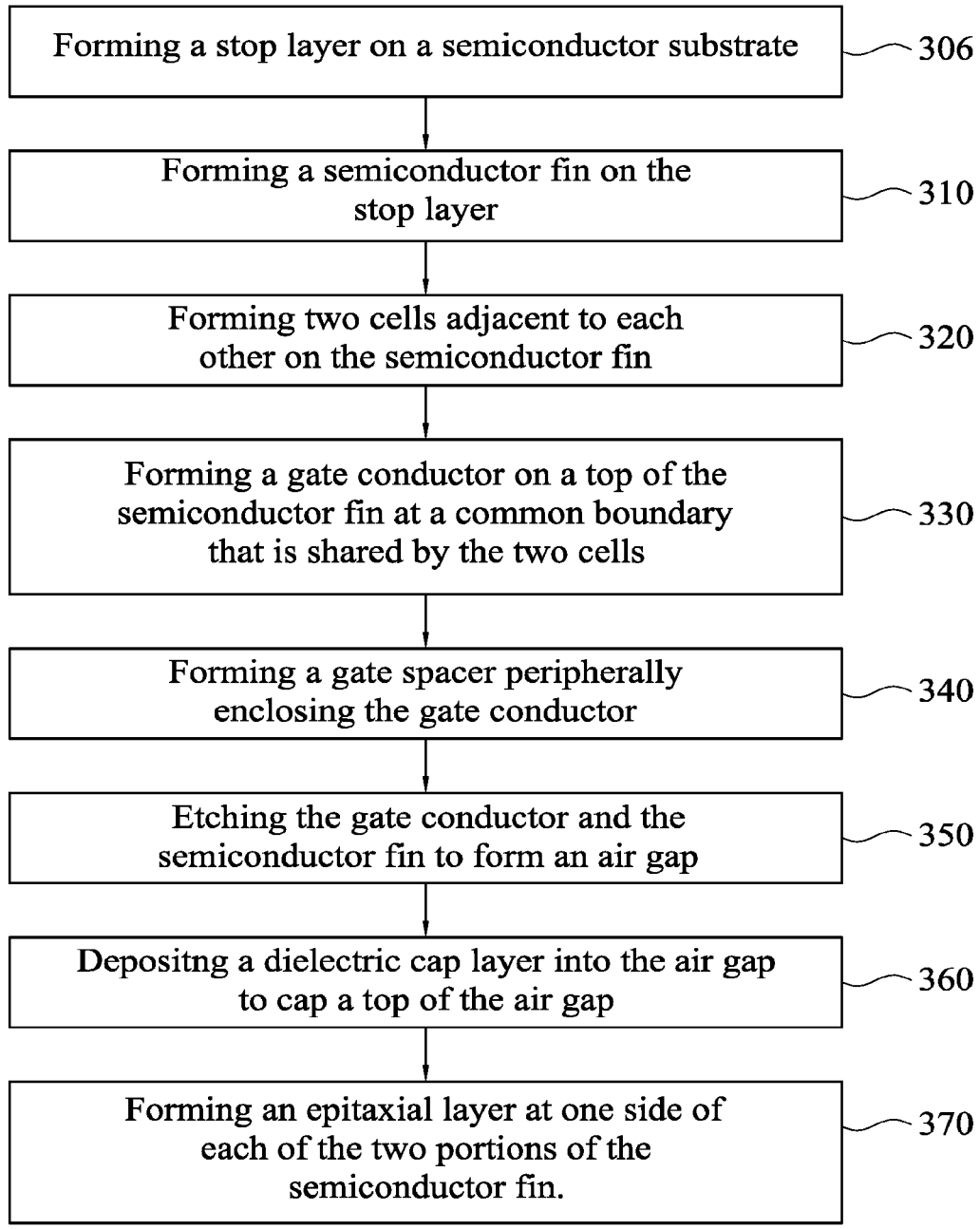
FIG. 3 is a flow chart showing a method for fabricating a semiconductor device in accordance with some embodiments of the present disclosure.

Thereafter, as shown in FIG. 2F, an exposed portion of the gate dielectric 242 and the underlying semiconductor fin 220 are etched to form an air gap (opening) 252 by using the gate spacer 244 as a mask. The gate dielectric 242 and the semiconductor fin 220 may be etched using reactive ion etch (RIE) and/or other suitable processes. Numerous other embodiments of methods to form the air gap (opening) 252 may be suitable. The air gap 252 divides the semiconductor fin 220 into two portions 220a and 220b of the semiconductor fin 220 and ends on the stop layer 212. Then, as shown in FIG. 2G, a dielectric cap layer 254 is formed between the dummy gate spacer 244a and the dummy gate spacer 244b. The dielectric cap layer 254 caps a top of the air gap 252, and is used as a support for subsequent processes such as metal landing. Only a small thickness of the dielectric cap layer 254 is needed, as long the dielectric cap layer 254 is strong enough to support the elements to be implemented in the subsequent processes. Thus, the dielectric constant of the area between the two portions 220a and 220b of the semiconductor fin 220 can be kept as small as possible, because the air gap 252 occupies a large part of the area between the two portions 220a and 220b. The dielectric cap layer 254 may include silicon nitride (SiN), oxynitride, silicion carbon (SiC), silicon oxynitride (SiON), oxide, and the like and may be formed by methods utilized to form such a layer, such as chemical vapor deposition (CVD), plasma enhanced CVD, sputter, and other methods known in the art.

Referring to FIG. 2F' and FIG. 2G', FIG. 2F' and FIG. 2G' are schematic cross-sectional views of intermediate stages showing a method for fabricating the semiconductor device viewed along line B1-B1' in FIG. 2A in accordance with certain embodiments of the present disclosure. In certain embodiments, the stop layer 212 underlying the semiconductor fin 220 is also etched, such that the air gap 252 extends to a portion of the semiconductor substrate 210 through the stop layer 212 from tops of two portions 220a and 220b of the semiconductor fin 220. The larger depth into the semiconductor substrate 210 can achieve higher performance in terms of leakage current for the cells A and B. The stop layer 212 may be etched by using $C_xF_y$, $NF_x$, $N_2$, $O_2$, $Cl_2$, Ar, $SF_x$, $C_xH_yF_z$ or HBr as an etchant, where x and y are greater than 0.

Then, as shown in FIG. 2G', the dielectric cap layer 254 fills the air gap 252, and is used as a support for subsequent processes such as metal landing. Because the dielectric cap layer 254 and the air gap 252 have low dielectric constants, and are excellent electrical isolators, such that leakage between the cell A and the cell B can be avoided even with small widths of the dielectric cap layer 254 and the air gap 252. In some embodiments, the two portions 220a and 220b of the semiconductor fin 220 are spaced at a distance in a range from about 5 nm to about 50 nm, and the claimed scope of the present disclosure is not limited in this respect. Because the dielectric cap layer 254 and the air gap 252 are formed within the semiconductor fin 220, no additional area is needed to form the fin isolation structure, and thus the device size can be shrunk.

It is noted that the air gap 252 may be formed with different cross-sectional profiles. In some examples, the air gap 252 may include a first air gap on the stop layer 212, and a second air gap above the first air gap, in which the first air gap has a trapezoidal cross-section, and the second air gap has a rectangular cross-section, as shown in FIG. 1D. In certain examples, the air gap 252 may be formed with a flat bottom enclosed by an arc surface, as shown in FIG. 1F.

Referring to FIG. 3 and FIG. 2A to FIG. 2F, FIG. 3 is a flow chart showing a method for fabricating the semiconductor device 200 in accordance with some embodiments of the present disclosure. The method begins at operation 306, where a stop layer 212 is formed on a semiconductor fin 220, as shown in FIG. 2A. Then, at operation 310, a semiconductor fin 220 is formed on the stop layer 212, as shown in FIG. 2A. At operation 320, two cells A and B adjacent to each other are formed on the semiconductor fin 220, as shown in FIG. 2B. Gate structures 230a, 230b, 230c, 230d and 230e are formed to cross over the semiconductor fin 220. The gate structure 230b is a functional or operational gate structure for the cell A, and the gate structures 230a and 230c will be processed in operations 350 and 360 to become dummy gate structures acting as PODEs for protecting the ends of the semiconductor fin 220 of the cell A during processing. The gate structure 230d is a functional or operational gate structure for the cell B, and the gate structures 230c and 230e will be processed in operations 350 and 360 to become dummy gate structures acting as PODEs for protecting the ends of the semiconductor fin 220 of the cell B during processing. The gate structure 230c acts as the PODE for preventing leakage between the cell A and the cell B.

At operation 330, a gate conductor 248 of the gate structure 230c is formed on a top of the semiconductor fin 220 at a common boundary that is shared by the two cells A and B, as shown in FIG. 2C. At operation 340, a gate spacer 244 peripherally enclosing the gate conductor 248 is formed on the semiconductor fin 220, as shown in FIG. 2C. At operation 350, the gate conductor 248 and the semiconductor fin 220 are etched to form a air gap 252, thereby dividing the semiconductor fin 220 into two portions 220a and 220b of the semiconductor fin, as shown in FIG. 2D to FIG. 2F. In some embodiments, the gate conductor 248, the semiconductor fin 220, the stop layer 212 and a portion of the semiconductor substrate 210 are etched to form a air gap 252, as shown in FIG. 2D and FIG. 2E' to FIG. 2F'. At operation 360, a dielectric cap layer 254 is deposited into the air gap 252 to cap a top of the air gap242, as shown in FIG. 2G or FIG. 2G'. The dielectric cap layer 254 may include silicon nitride (SiN), oxynitride, silicion carbon (SiC), silicon oxynitride (SiON), oxide, and the like and may be formed by methods utilized to form such a layer, such as chemical vapor deposition (CVD), plasma enhanced CVD, sputter, and other methods known in the art. The dielectric cap layer 254 is used as a support for subsequent processes such as metal landing. The air gap 252 with the dielectric cap layer 254 is used for preventing leakage between the cell A and the cell B. At operation 370, an epitaxial layer 222a or 222b is formed at one side of each of the two portions 220a and 220b of the semiconductor fin 220, as shown in FIG. 2G. The epitaxial layers 222a is a source/drain portion of the cell A, and the epitaxial layer 222b is a source/drain portion of anther cell abutting the cell B.

In accordance with an embodiment of the present disclosure, the present disclosure discloses a semiconductor device including a semiconductor substrate, a stop layer on the semiconductor substrate, a semiconductor fin on the stop layer, and two cells adjacent to each other on the semiconductor fin, in which the semiconductor fin has a fin isolation structure at a common boundary that is shared by the two cells. The fin isolation structure has an air gap extending from a top of the semiconductor fin to the stop layer, in which the air gap divides the semiconductor fin into two portions of the semiconductor fin. The fin isolation structure includes a dielectric cap layer capping a top of the air gap.

In accordance with another embodiment of the present disclosure, the present disclosure discloses a semiconductor device including a semiconductor substrate, a stop layer on the semiconductor substrate, and a semiconductor fin on the stop layer, in which each of two opposite ends of the semiconductor fin has a fin isolation structure. The fin isolation structure has an air gap extending from a top of the semiconductor fin to the stop layer, in which the air gap divides the semiconductor fin into two portions of the semiconductor fin. The fin isolation structure includes a dielectric cap layer capping a top of the air gap.

In accordance with yet another embodiment, the present disclosure discloses a method for forming a semiconductor device. In this method, a stop layer is formed on a semiconductor substrate, and a semiconductor fin is formed on the stop layer. Two cells adjacent to each other are formed on the semiconductor fin. A gate conductor is formed on a top of the semiconductor fin at a common boundary that is shared by the two cells. A gate spacer is formed to peripherally enclose the gate conductor. The gate conductor and the semiconductor fin are etched to form an air gap extending from a top of the semiconductor fin to the stop layer, thereby dividing the semiconductor fin into two portions of the semiconductor fin. A dielectric cap layer is deposited into the air gap to cap a top of the air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first epitaxial layer;
a first semiconductor layer having a first sidewall facing the first epitaxial layer;
a second semiconductor layer, wherein:
an air gap is defined between a second sidewall of the first semiconductor layer and a first sidewall of the second semiconductor layer, and
the first sidewall of the first semiconductor layer is diametrically opposite the second sidewall of the first semiconductor layer; and
a gate dielectric overlying the first semiconductor layer, wherein the air gap is further defined by a first sidewall of the gate dielectric.

2. The semiconductor device of claim 1, comprising:
a dielectric cap layer defining a top of the air gap.

3. The semiconductor device of claim 2, comprising:
a first gate spacer overlying the first semiconductor layer; and
a second gate spacer overlying the second semiconductor layer, wherein the dielectric cap layer is disposed between the first gate spacer and the second gate spacer.

4. The semiconductor device of claim 1, wherein:
a second sidewall of the gate dielectric faces the first epitaxial layer, and
the first sidewall of the gate dielectric is diametrically opposite the second sidewall of the gate dielectric.

5. The semiconductor device of claim 4, wherein the second sidewall of the gate dielectric is in contact with the first epitaxial layer.

6. The semiconductor device of claim 1, wherein the first sidewall of the first semiconductor layer is in contact with the first epitaxial layer.

7. The semiconductor device of claim 1, comprising:
a stop layer underlying the first semiconductor layer and defining a bottom of the air gap.

8. The semiconductor device of claim 7, comprising:
a dielectric cap layer defining a top of the air gap, such that the air gap is between the stop layer and the dielectric cap layer.

9. The semiconductor device of claim 1, comprising:
a stop layer underlying the first semiconductor layer, wherein the air gap is further defined by a sidewall of the stop layer.

10. The semiconductor device of claim 9, comprising:
a substrate underlying the stop layer and defining a bottom of the air gap.

11. The semiconductor device of claim 10, comprising:
a dielectric cap layer defining a top of the air gap, such that the air gap is between the substrate and the dielectric cap layer.

12. The semiconductor device of claim 10, wherein the air gap is further defined by a sidewall of the substrate.

13. The semiconductor device of claim 1, comprising:
a substrate underlying the first semiconductor layer and defining a bottom of the air gap.

14. A method for forming a semiconductor device, the method comprising:
forming a first gate structure and a second gate structure over a semiconductor fin;
forming a photoresist over the first gate structure, wherein the second gate structure is exposed through the photoresist;
removing the second gate structure while the second gate structure is exposed through the photoresist to define a first opening; and
removing a portion of the semiconductor fin through the first opening to define an air gap.

15. The method of claim 14, comprising:
forming a first dielectric layer between the first gate structure and the second gate structure prior to forming the photoresist.

16. The method of claim 14, comprising:
forming a dielectric cap layer, the dielectric cap layer defining a top of the air gap.

17. The method of claim 16, comprising:
forming a first gate spacer and a second gate spacer prior to forming the photoresist, wherein:
the second gate structure is between the first gate spacer and the second gate spacer, and
forming the dielectric cap layer comprises forming the dielectric cap layer between the first gate spacer and the second gate spacer.

18. The method of claim 14, wherein removing the portion of the semiconductor fin through the first opening comprises dividing the semiconductor fin into a first portion and a second portion separated from the first portion by the air gap.

19. A semiconductor device, comprising:
a first semiconductor fin;
a second semiconductor fin;
a first gate spacer overlying the first semiconductor fin;
a second gate spacer overlying the second semiconductor fin; and
a dielectric cap layer between the first gate spacer and the second gate spacer, wherein an air gap is defined between the first semiconductor fin and the second semiconductor fin and below the dielectric cap layer.

20. The semiconductor device of claim 19, comprising:
a gate dielectric overlying the first semiconductor fin, wherein the air gap is further defined by a first sidewall of the gate dielectric.

* * * * *